US006707347B2

(12) United States Patent
Oita

(10) Patent No.: US 6,707,347 B2
(45) Date of Patent: Mar. 16, 2004

(54) CRYSTAL OSCILLATOR THAT UTILIZES THE POWER TRANSISTOR OF AN OUTPUT AMPLIFIER TO HEAT THE CRYSTAL RESONATOR

(75) Inventor: Takeo Oita, Saitama (JP)

(73) Assignee: Nihon Dempa Kogyo, Co., Ltd., Tokyo (JP)

(*) Notice: Subject to any disclaimer, the term of this patent is extended or adjusted under 35 U.S.C. 154(b) by 11 days.

(21) Appl. No.: 10/054,281

(22) Filed: Jan. 22, 2002

(65) Prior Publication Data

US 2002/0101290 A1 Aug. 1, 2002

(30) Foreign Application Priority Data

Jan. 26, 2001 (JP) ......................... 2001-017865

(51) Int. Cl.$^7$ ................................. H03L 1/00
(52) U.S. Cl. ....................... 331/176; 311/69; 311/70; 311/66; 310/315
(58) Field of Search .................. 331/74, 116 R, 331/158, 69, 70, 176, 66; 310/315, 346, 341, 343

(56) References Cited

U.S. PATENT DOCUMENTS

| 4,586,006 A | | 4/1986 | Emmons |
| 4,593,258 A | * | 6/1986 | Block ..................... 331/176 |
| 6,147,565 A | * | 11/2000 | Satoh et al. ............... 331/70 |

FOREIGN PATENT DOCUMENTS

| DE | 3326286 | | 5/1985 |
| GB | 2100888 | | 1/1983 |
| JP | 55-110981 | * | 8/1980 |
| JP | 56-87911 | * | 7/1981 |

OTHER PUBLICATIONS

Shmaly "The Modulational Method of the Precision Quartz–Crystal Oscillators and Standards Frequency Stabilization" 1995 IEEE.*
International Frequency Controls Symposium pp. 519–589.*
Tooley "Electronic Circuits Handbook" Butter–worth–Heinemann Ltd 1994 pp. 61–69.*
Hiroaki Akagawa, "Crystal Oscillators Play Key Role in Expanding Mobile Phone Arena", JEE Journal of Electronic Engineering, Dec. 27, 1990, No. 288, pp. 32–35.
Abramzon et al., "Miniature OCXO Using DHR Technology", IEEE International Frequency Control Symposium, May 28–30, 1997, pp. 943–946.

* cited by examiner

Primary Examiner—Michael B. Shingleton
(74) Attorney, Agent, or Firm—Greer, Burns & Crain, Ltd

(57) ABSTRACT

A crystal oscillator according to the present invention prevents abnormal oscillation at a temperature in a low-temperature area equal to or lower than an ordinary temperature. The crystal oscillator is configured such that a crystal vibrator is made to abut against a heat source, and the temperature of the crystal vibrator can be kept higher than a temperature where abnormal oscillation occurs. The temperature of the crystal vibrator is assumed to be, for example, higher than 0° C. Additionally, as the heat source, for example, a power transistor that amplifies an oscillation output is used.

9 Claims, 4 Drawing Sheets

CRYSTAL OSCILLATOR THAT UTILIZES THE POWER TRANSISTOR OF AN OUTPUT AMPLIFIER TO HEAT THE CRYSTAL RESONATOR

BACKGROUND OF THE INVENTION

1. Field of the Invention

The present invention relates to a crystal oscillator, and more particularly, to a crystal oscillator preventing abnormal oscillation by which an oscillation frequency suddenly (discontinuously) changes due to a temperature change.

2. Description of the Related Art

A crystal oscillator is used as a frequency and time reference source in various types of electronic devices such as a digital control device, a communications device, etc. Among communication devices where a crystal oscillator is used, a communications device that is normally installed outdoors and demanded to be used under an environment of a severe temperature change, for example, like a broadband wireless communications device which secures a large amount of a communications line.

FIGS. 1 and 2 exemplify a general crystal oscillator. FIG. 1 is a circuit diagram showing the crystal oscillator, whereas FIG. 2 is a cross-sectional view of the structure of the crystal oscillator.

The crystal oscillator is mainly composed of a crystal vibrator 1 and an oscillation circuit unit 2, and forms, for example, an oscillation circuit 3 of a Colpitts type. The crystal vibrator 1 has a configuration where an electrode (not shown) is formed, for example, in an AT-cut quartz crystal element, and the quartz crystal element is held and hermetically sealed in a metal box 5 from which a lead 4 is extended.

The oscillation circuit unit 2 is composed of a capacitor that forms a resonance circuit along with the crystal vibrator 1 (inductor component), an amplifier for oscillation, etc. Normally, an oscillation amplifying stage 6 amplifying the oscillation output from the oscillation circuit unit 2 is connected to the oscillation circuit unit 2. The crystal vibrator 1 and other elements 7, which form the crystal oscillator, are arranged on a circuit board 9 having a lead 8, and sealed by a cover not shown.

With such a crystal oscillator, the oscillation frequency of an output signal changes with temperature mainly due to the frequency-temperature characteristic of the crystal vibrator 1.

If the quartz crystal element of the crystal vibrator 1 is AT-cut, the frequency-temperature characteristic of an oscillation frequency becomes a tertiary curve whose inflection point is close to an ordinary temperature (25° C.). Normally, as shown in FIG. 3, a crystal vibrator is selected so that the frequency-temperature characteristic that has a maximum value in a low-temperature area equal to or lower than an ordinary temperature, and a minimum value in a high-temperature area higher than the ordinary temperature is implemented. Namely, the crystal vibrator (the cutting angle of the AT cutting) is selected to have such a frequency-temperature characteristic, whereby an oscillation frequency change due to a temperature change is suppressed within a monotonously changing range between the maximum and the minimum values in a wide temperature range having the ordinary temperature as a center. Note that the temperature points of the maximum and the minimum values depend on the cutting angle of the AT cutting.

However, the crystal oscillator having the above described configuration has a problem of causing abnormal oscillation in a low-temperature area of 0° C. or lower. The abnormal oscillation referred to here means not a phenomenon that an oscillation frequency moderately changes according to the frequency-temperature characteristic, but a phenomenon that the oscillation frequency discontinuously changes, and is commonly called a jump (micro-jump) of an oscillation frequency.

FIG. 4 shows such a jump (micro-jump) in the frequency-temperature characteristic of the crystal vibrator.

The frequency-temperature characteristic has an extremely small resonance point at a certain temperature point equal to or lower than 0° C. due to some reason or coincidence of a plurality of conditions, so that an oscillation frequency suddenly changes, for example, as shown in FIG. 4. This is also called a micro-jump, and is not found when the frequency-temperature characteristic is measured in a manufacturing process. For this reason, there is a problem that abnormal oscillation in a low-temperature area cannot be avoided under an environment of 0° C. or lower. Note that, however, the micro-jump does not occur in all of crystal oscillators.

The above provided example refers to a mere crystal oscillator. However, abnormal oscillation occurs similarly, for example, in a crystal oscillator having a configuration where a compensation voltage is applied by inserting a voltage variable capacity element, which is not shown, in an oscillation closed loop of the crystal oscillator, or in a crystal oscillator of, what is called, a temperature compensation type, which compensates for and flattens the frequency-temperature characteristic by inserting a temperature compensation circuit composed of a parallel circuit of a thermistor and a capacitor in an oscillation closed loop.

Namely, even in these crystal oscillators, the crystal vibrator 1 itself depends on an ambient temperature, and exhibits the frequency-temperature characteristic having a resonance point in a low-temperature area. Therefore, a sudden change cannot be avoided although temperature compensation is made, and abnormal oscillation occurs. As a factor of causing a micro-jump, there are various theories such as a result of a phenomenon that condensation occurs at a temperature equal to or lower than 0° C. on the surface of a quartz crystal element within a sealed box, and the like. However, its details are not elucidated at the present moment.

SUMMARY OF THE INVENTION

The present invention aims at providing a crystal oscillator preventing abnormal oscillation in a low-temperature area.

A crystal oscillator according to the present invention comprises an oscillation unit and a heat source unit.

The oscillation unit is composed of a crystal vibrator having a frequency-temperature characteristic with which a resonance frequency changes according to a temperature, and an oscillation circuit unit.

The heat source unit, which abuts against the crystal vibrator, keeps the temperature of the crystal vibrator higher than a temperature at which the crystal vibrator causes abnormal oscillation.

A crystal oscillator having another configuration of the present invention comprises an oscillation unit having a crystal vibrator, and a heat source unit keeping the temperature of the crystal vibrator higher than a temperature where the crystal vibrator causes abnormal oscillation.

This abnormal oscillation is caused, for example, by a micro-jump that occurs in the crystal vibrator.

The crystal vibrator is kept, for example, at a temperature higher than 0° C.

The heat source unit is configured, for example, by a power transistor that amplifies an oscillation output.

According to the present invention, the crystal vibrator is kept by the heat source unit at a temperature higher than a particular temperature, so that abnormal oscillation does not occur even in a low-temperature

DESCRIPTION OF THE PREFERRED EMBODIMENT

First of all, the fundamental principle of the present invention is described.

According to the present invention, attention is focused on a point that the above described micro-jump problem does not occur if a crystal vibrator is kept at a temperature higher than a temperature point (0° C. or lower), where abnormal oscillation occurs, in a low-temperature area equal to or lower than the ordinary temperature, and the crystal vibrator is made to abut against a heat source, for example, a power transistor, like a thermostatic oven used in a crystal oscillator of a thermostatic oven disclosed by Japanese Patent Publication No. 1-195706, or the like.

As a result, the crystal vibrator is kept at a temperature higher than a temperature (a temperature point in a low-temperature area equal to or lower than the ordinary temperature, for example, a temperature point of 0° C. or lower) where abnormal oscillation is caused. Accordingly, even if the ambient temperature becomes a temperature in the low-temperature area where abnormal oscillation is caused, the crystal oscillator does not become the temperature where the abnormal oscillation occurs.

A crystal oscillator according to one preferred embodiment of the present invention is described below.

Figure 1:
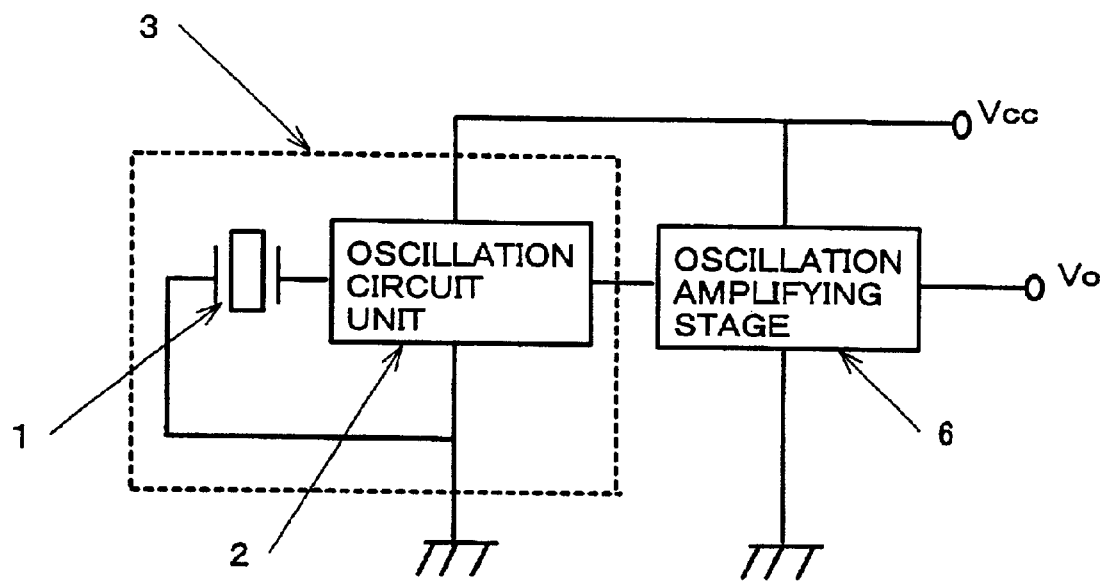
FIG. 1 is a circuit diagram showing a general crystal oscillator.

A crystal oscillator according to this preferred embodiment comprises a crystal vibrator 1 where an AT-cut quartz crystal element is hermetically sealed within a metal box 5 having a lead 4, an oscillation circuit unit 2 having a capacitor and an amplifier for oscillation, and an oscillation amplifying stage 6, similar to the crystal oscillator represented by the block diagram of FIG. 1. The crystal vibrator 1 and other elements 7, which configure the crystal oscillator, are arranged on a circuit board 9.

If voltage is applied to an oscillation circuit 3, the crystal vibrator 1 is excited, an output signal of a particular frequency determined by the shape of the quartz crystal element of the crystal vibrator 1 is output from the oscillation circuit 3, and the signal is amplified and output by the oscillation amplifying stage 6.

Figure 2:
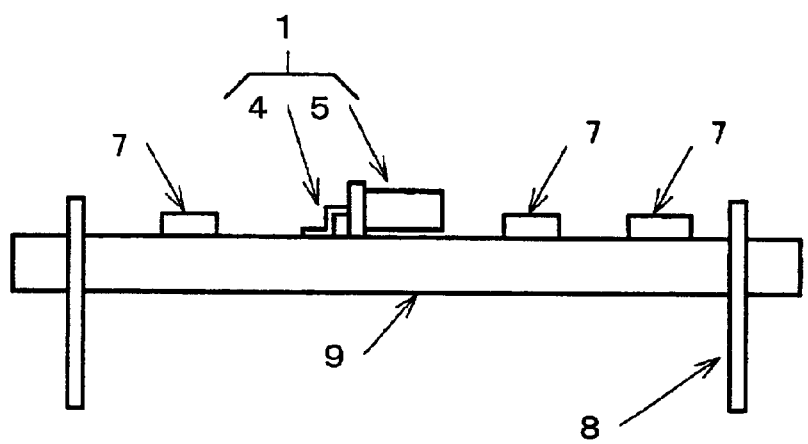
FIG. 2 is a cross-sectional view of the general crystal oscillator.
Figure 3:
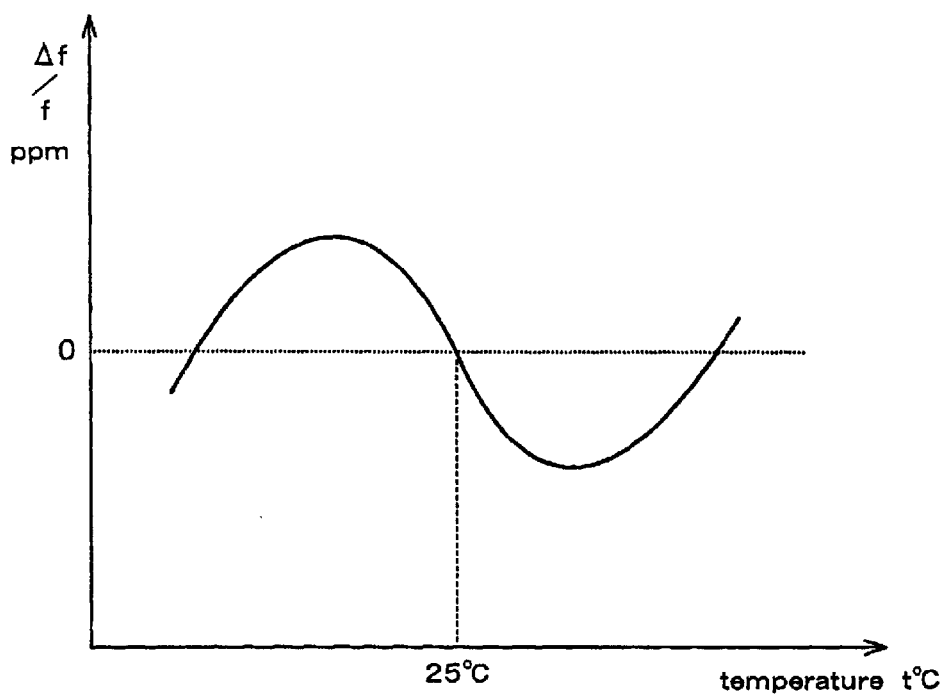
FIG. 3 shows the frequency-temperature characteristic of a general crystal vibrator.
Figure 4:
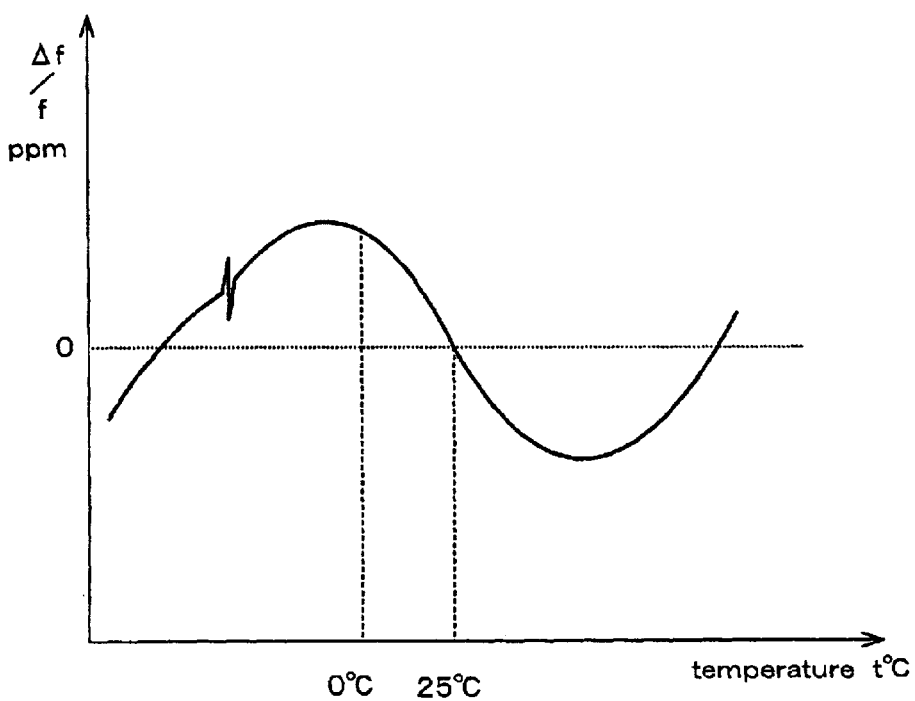
FIG. 4 shows the frequency-temperature characteristic of a crystal vibrator in order to explain a micro-jump.
Figure 5:
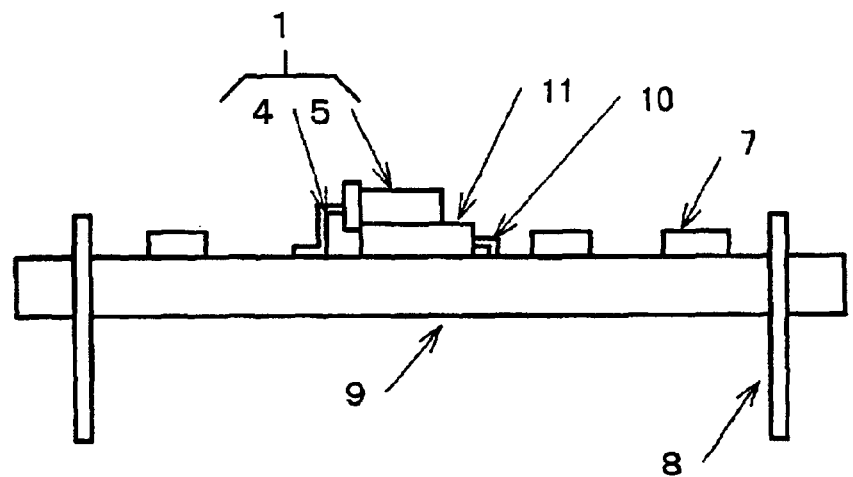
FIG. 5 is a cross-sectional view of a crystal oscillator according to a preferred embodiment.

FIG. 5 is a cross-sectional view of the crystal oscillator according to this preferred embodiment. In this figure, the same constituent elements as those of the crystal oscillator represented by the cross-sectional view of FIG. 2 are denoted with the same reference numerals, and detailed explanation about these elements are omitted in the explanation provided below.

In the crystal oscillator shown in FIG. 5, a power transistor 11 having a lead 10 independent from an oscillation circuit is arranged on a circuit board 9. Additionally, the crystal oscillator 1 is placed so that it abuts against the power transistor 11. Here, the main surface of the crystal vibrator 1 (a metal box 5) is made to face and abut against the power transistor 11, and a lead 4 is bent to connect to a wiring pattern (not shown) of the circuit board 9.

With such a configuration, the crystal vibrator 1 is kept at least at a temperature higher than 0° C. by the heat generated by the power transistor 11. Accordingly, even if an ambient temperature changes to a temperature in the low-temperature area, for example, 0° C. or lower, the crystal vibrator is kept at a temperature higher than 0° C. Consequently, the crystal oscillator can supply a stable oscillation frequency without causing abnormal oscillation which arises at a temperature point of 0° C. or lower.

In FIG. 5, a crystal vibrator having a configuration where the quartz crystal element is hermetically sealed within the metal box 5 having the lead 4 is adopted as the crystal vibrator 1. However, the present invention is also applicable, for example, to a crystal vibrator for surface mounting, in which a quartz crystal element is hermetically sealed within a ceramic box having a mounting electrode on its rear side.

Figure 6:
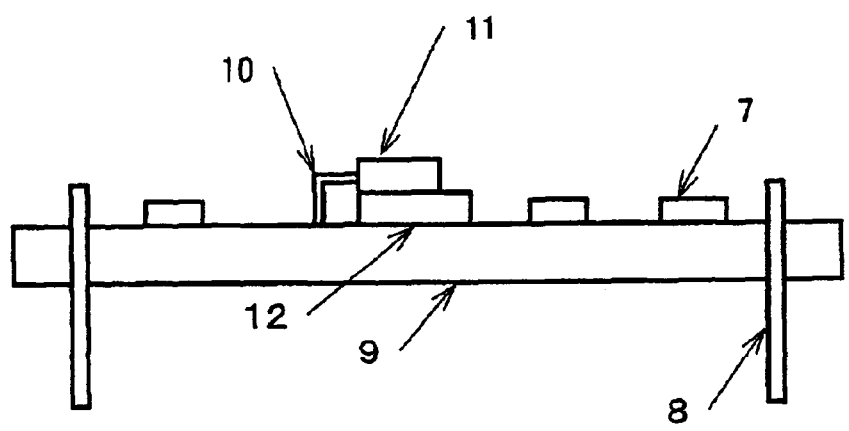
FIG. 6 is a cross-sectional view of a crystal oscillator in the case where a crystal vibrator for surface mounting is used.

FIG. 6 is a cross-sectional view of the crystal oscillator in this case.

In this figure, a crystal vibrator 12 for surface mounting is mounted on a circuit board 9, and a power transistor 11 is placed on the crystal vibrator 12 so that the heat is conveyed to the crystal vibrator 12.

The power transistor 11 that is used as a heat source may be newly arranged only for the use purpose of a heat source. Or, a transistor used for another purpose, such as a power transistor for amplifying an oscillation output, a power transistor of a power supply or a regulator may be available. Or, heat generated by a collector (source) loss of a transistor of a transmitter may be available as a heat source.

Additionally, the temperature of the crystal vibrator is assumed to be kept higher than 0° C. However, for example, if a temperature in a low-temperature area, at which the crystal vibrator causes abnormal oscillation, is clear, the crystal vibrator may be kept at a temperature higher than that temperature.

Furthermore, the above described preferred embodiment adopts the power transistor 11 as a heat source which makes the crystal vibrator warm. However, other elements may be available as a heat source only if the temperature of the crystal vibrator can be kept higher than a temperature point where abnormal oscillation is caused. For example, a ceramic heater, a crystal vibrator around which a nichrome wire is wound may be available.

Still further, in the above described preferred embodiment, the crystal vibrator is merely placed on the heat source. However, the amount of heat generated by this heat source may be varied according to a temperature.

Figure 7:
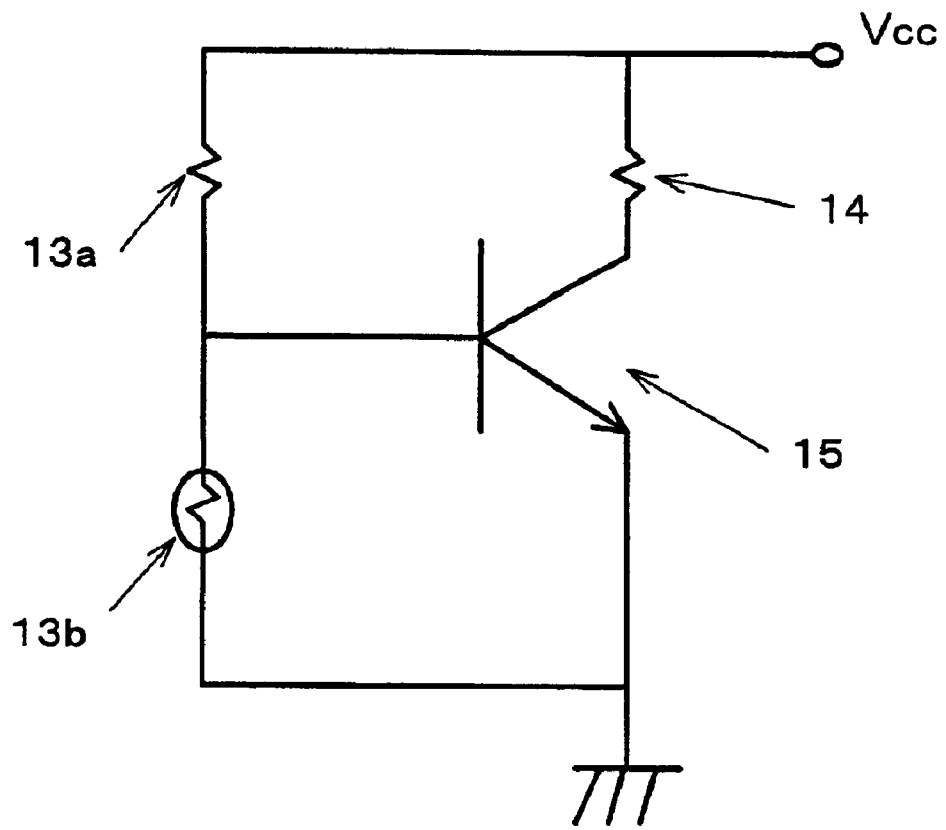
FIG. 7 is a circuit diagram of a control circuit having a configuration where the amount of heat is changed according to a temperature.

FIG. 7 exemplifies an implementation of the configuration where the amount of heat is varied according to a temperature. In the configuration example shown in this figure, an electric current that is supplied to a heat source is controlled by a thermo-sensitive element (such as a posistor or a thermistor), so that the amount of heat is increased at a low temperature.

In the configuration shown in this figure, a power transistor 15, which becomes a heat source, is emitter-grounded, and a load resistor 14 and bias resistors 13*a* and 13*b* are respectively arranged on collector and base sides. The resistor 13*b* on the grounded side among the two base bias resistors 13*a* and 13*b* is assumed as a thermistor whose resistance value decreases with an increase in the temperature.

With such a configuration, the resistance value of the resistor 13*b* decreases as the temperature rises. As a result, the bias voltage of the power transistor 15 drops, so that the current between the emitter and the collector decreases, and the amount of heat generated by the power transistor 15 becomes small. Inversely, the bias voltage rises as the temperature drops. Therefore, the current between the emitter and the collector increases, and the amount of heat generated by the power transistor 15 becomes large.

The configuration of this preferred embodiment differs from an existing crystal oscillator using a thermostatic oven. Namely, with the existing crystal oscillator having a thermostatic oven, a crystal vibrator must be kept at a constant temperature, for example, a temperature which becomes a minimum value on a high temperature side. Therefore, a control circuit for this implementation becomes strict (complex). However, with the crystal oscillator according to this preferred embodiment, it is sufficient to only keep a crystal vibrator at a temperature higher than a predetermined temperature. Therefore, its control circuit becomes extremely simple. Accordingly, the existing crystal oscillator and the crystal oscillator according to the present invention definitely differ.

Furthermore, the above provided explanation takes a mere crystal oscillator as an example. However, the present invention is applicable also to the above described crystal oscillator having a configuration where a compensation voltage is applied by inserting a voltage variable capacity element in an oscillation closed loop of the crystal oscillator, and to the temperature compensation oscillator that comprises a temperature compensation circuit and flattens a frequency-temperature characteristic. The temperature compensation oscillator may be configured so that a thermo-sensitive element of the temperature compensation circuit is arranged close to a heat source, and the temperature of a crystal vibrator is detected by the thermo-sensitive element and compensated.

What is claimed is:

1. A crystal oscillator, comprising:

an oscillation unit comprising a crystal vibrator having a frequency-temperature characteristic with which a resonance frequency changes according to a temperature, and an oscillation circuit unit; and a heat source unit, which abuts against the crystal vibrator, keeping a temperature of the crystal vibrator higher than a temperature where the crystal vibrator causes abnormal oscillations, wherein said heat source unit is configured by a power transistor which amplifies an oscillation output.

2. The crystal oscillator according to claim 1, wherein the crystal vibrator is kept at a temperature higher than 0° C.

3. The crystal oscillator according to claim 1, wherein the abnormal oscillation is caused by a micro-jump which occurs in the crystal vibrator.

4. A crystal oscillator, comprising:

an oscillation unit having a crystal vibrator; and a heat source unit keeping a temperature of the crystal vibrator higher than a temperature where the crystal vibrator causes abnormal oscillation, wherein said heat source unit is configured by a power transistor which amplifies an oscillation output.

5. The crystal oscillator according to claim. 4, wherein said heat source unit keeps the crystal vibrator at a temperature higher than 0° C.

6. The crystal oscillator according to claim 4, wherein the abnormal oscillation is caused by a micro-jump which occurs in the crystal vibrator.

7. The crystal oscillator according to claim 4, further comprising a control unit controlling heat generated by said heat source unit based on a temperature of the crystal vibrator.

8. A crystal oscillator, comprising:

oscillation means having a crystal vibrator; and heat source means for keeping a temperature of the crystal vibrator higher than a temperature where the crystal vibrator causes abnormal oscillation, wherein said heat source means is configured by a power transistor which amplifies an oscillation output.

9. A signal oscillation method preventing abnormal oscillation of an oscillator having a crystal vibrator, comprising:

keeping a temperature of the crystal vibrator higher than a temperature where the crystal vibrator causes abnormal oscillation, using a heat source unit configured by a power transistor which amplifies an oscillation output; and outputting a signal in a state where the temperature is kept.

* * * * *